United States Patent
Wu et al.

(10) Patent No.: US 11,251,362 B2
(45) Date of Patent: Feb. 15, 2022

(54) STACKED SPIN-ORBIT-TORQUE MAGNETORESISTIVE RANDOM-ACCESS MEMORY

(71) Applicant: International Business Machines Corporation, Armonk, NY (US)

(72) Inventors: Heng Wu, Guilderland, NY (US); Julien Frougier, Albany, NY (US); Ruilong Xie, Niskayuna, NY (US); Chen Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 16/793,292

(22) Filed: Feb. 18, 2020

(65) Prior Publication Data

US 2021/0257543 A1    Aug. 19, 2021

(51) Int. Cl.
| | | |
|---|---|---|
| *H01L 43/04* | (2006.01) | |
| *H01L 43/14* | (2006.01) | |
| *H01L 43/06* | (2006.01) | |
| *H01L 27/22* | (2006.01) | |
| *H01F 10/32* | (2006.01) | |
| *H01L 43/08* | (2006.01) | |
| *H01L 43/10* | (2006.01) | |
| *H01L 43/12* | (2006.01) | |

(52) U.S. Cl.
CPC ........... *H01L 43/04* (2013.01); *H01F 10/329* (2013.01); *H01L 27/228* (2013.01); *H01L 43/06* (2013.01); *H01L 43/08* (2013.01); *H01L 43/10* (2013.01); *H01L 43/12* (2013.01); *H01L 43/14* (2013.01)

(58) Field of Classification Search
CPC ............. H01F 10/239; H01L 43/00–14; H01L 27/222–228; H01L 43/04; H01L 43/06; H01L 43/08; H01L 43/14
See application file for complete search history.

(56) References Cited

U.S. PATENT DOCUMENTS

| | | |
|---|---|---|
| 9,646,670 B2 | 5/2017 | Lee |
| 9,768,229 B2 | 9/2017 | Braganca |
| 9,830,966 B2 | 11/2017 | Mihajlovic |
| 9,858,975 B1 * | 1/2018 | Hatcher .............. G11C 11/1659 |
| 9,953,692 B1 | 4/2018 | Mihajlovic |
| 10,229,723 B1 | 3/2019 | Choi |

(Continued)

OTHER PUBLICATIONS

Garello et al., "SOT-MRAM 300mm integration for low power and ultrafast embedded memories", Preprint—Oct. 2018, 3 pages.

*Primary Examiner* — Jose R Diaz
(74) *Attorney, Agent, or Firm* — David K. Mattheis; Maeve M. Carpenter

(57) ABSTRACT

A spin-orbit torque magnetoresistive random-access memory device formed by fabricating a first electrode upon a conductive contact of an underlying semiconductor device, forming a first vertical magnetoresistive random-access memory (MRAM) cell stack upon the first electrode, forming a spin-Hall-effect (SHE) layer above and in electrical contact with the MRAM cell stack, forming a protective dielectric layer covering a portion of the SHE layer, forming a second vertical MRAM cell stack above and in electrical contact with an exposed portion of the SHE layer, forming a second electrode above and in electrical contact with the second vertical MRAM cell stack, and forming a metal contact above and in electrical connection with the second electrode.

18 Claims, 10 Drawing Sheets

(56) References Cited

U.S. PATENT DOCUMENTS

| | | |
|---|---|---|
| 10,381,060 B2 | 8/2019 | Kan |
| 10,381,552 B2 | 8/2019 | Mihajlovic |
| 10,411,069 B1 | 9/2019 | Jacob |
| 10,453,511 B2 | 10/2019 | Lua |
| 2017/0365777 A1 | 12/2017 | Mihajlovic |
| 2019/0051815 A1* | 2/2019 | Kakinuma ............ H01L 43/08 |
| 2019/0079701 A1 | 3/2019 | Rakshit |
| 2019/0164586 A1 | 5/2019 | Chen |
| 2019/0165254 A1 | 5/2019 | Lee |
| 2020/0161542 A1* | 5/2020 | Ahn ..................... H01F 41/307 |

* cited by examiner

STACKED SPIN-ORBIT-TORQUE MAGNETORESISTIVE RANDOM-ACCESS MEMORY

BACKGROUND

The disclosure relates generally to stacked magnetoresistive random-access memory (MRAM). The disclosure relates particularly to stacked spin-orbit torque MRAM structures including a shared spin-Hall-effect (SHE) rail.

MRAM is a type of solid state, non-volatile memory that uses tunneling magnetoresistance (TMR) to store information. MRAM is made up of an electrically connected array of magnetoresistive memory elements, referred to as magnetic tunnel junctions (MTJs). Each MTJ includes a free layer and fixed layer that each include a layer of a magnetic material, and that are separated by a non-magnetic insulating tunnel barrier. The free layer has a variable magnetization direction, and the fixed layer has an invariable magnetization direction. An MTJ stores information by switching the magnetization state of the free layer. When the magnetization direction of the free layer is parallel to the magnetization direction of the fixed layer, the MTJ is in a low resistance state. Conversely, when the magnetization direction of the free layer is antiparallel to the magnetization direction of the fixed layer, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM. MRAM cells can be formed as a vertical stack enabling device design options for increasing device memory cell element density while maintaining or even reducing the scale of devices.

Spin-orbit-torque (SOT) MRAM cells include a spin-orbit torque, or spin-Hall-effect (SHE), layer in contact with the magnetic tunnel junction (MTJ) structure of the MRAM. The SHE is typically a heavy conductive metal, such as platinum or tantalum. Current is passed through the SHE layer, but not through the MTJ structure, to write to the cell and current is passed through the MTJ to read the cell. Since high voltage write energies are not passed though the MTJ of the MRAM cell, SOT MRAM tend to be more reliable and have a longer lifecycle. Less energy is used in writing the SOT MRAM, as the write energy does not pass through the MTJ. Passing the write current through the SHE layer, and not through the MTJ structure, also yields fewer writing errors, and higher writing speeds—further reducing the energy needed per write operation.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a spin-orbit torque magnetoresistive random-access memory device formed by fabricating a first electrode upon a conductive contact of an underlying semiconductor device, forming a first vertical magnetoresistive random-access memory (MRAM) cell stack upon the first electrode, forming a spin-Hall-effect (SHE) layer above and in electrical contact with the MRAM cell stack, forming a protective dielectric layer covering a portion of the SHE layer, forming a second vertical MRAM cell stack above and in electrical contact with an exposed portion of the SHE layer, forming a second electrode above and in electrical contact with the second vertical MRAM cell stack, and forming a metal contact above and in electrical connection with the second electrode.

In one aspect, a spin-orbit torque magnetoresistive random-access memory device including a first vertical MRAM stack disposed upon a bottom electrode, a spin-Hall-effect (SHE) rail disposed above and in electrical contact with the first MRAM stack, and a second vertical MRAM stack disposed above and in electrical contact with the SHE rail.

In one aspect, a spin-orbit torque magnetoresistive random-access memory device including a first vertical MRAM stack disposed upon a bottom electrode, the bottom electrode in electrical communication with a semiconductor device transistor, a spin-Hall-effect (SHE) rail disposed above and in electrical contact with the first MRAM stack, and a second vertical MRAM stack disposed above and in electrical contact with the SHE rail.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
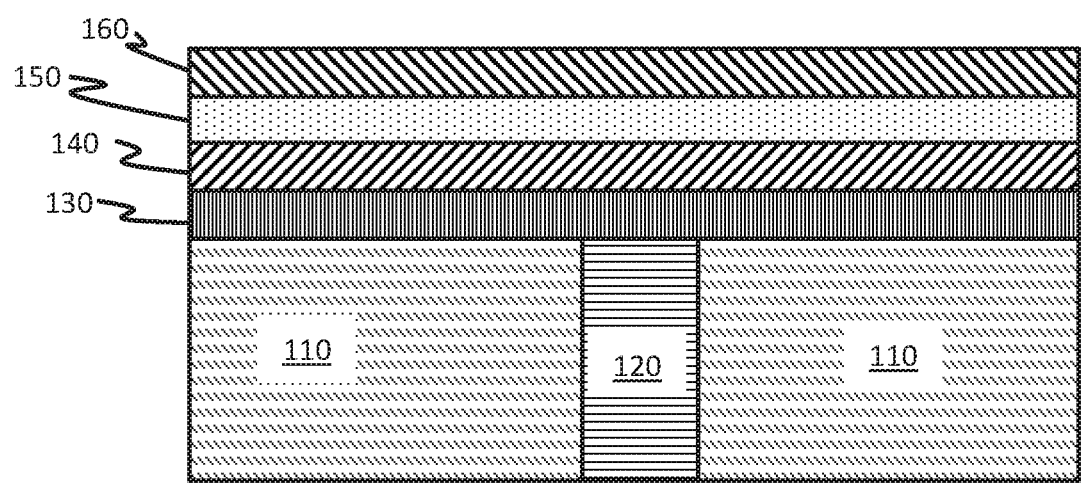
FIG. 1 provides a cross-sectional view of a step in the fabrication of a semiconductor device, according to an embodiment of the invention. The figure illustrates a stack of MRAM layers deposited upon an underlying semiconductor device.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein can be interpreted accordingly. In addition, it should be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Spin-transfer torque (STT) magnetoresistive random-access memory (MRAM) passes current through the magnetic tunnel junction of the memory cell during each of the read and write operations. High write energies can reduce the longevity of the devices by degrading the device materials. Spin-orbit torque (SOT) MRAM devices resolve this issue by only passing relatively low read operation energies directly through the magnetic tunnel junction of the MRAM cell. The SOT, or spin Hall-effect (SHE) plate of the SOT MRAM cell must have a cross sectional area equal to or greater than the rest of the MRAM cell stack to effectively alter the free layer and write to the cell. Writing to a SOT MRAM cell does not require passing energy through the SOT MRAM cell stack. Ion beam etching (IBE) during the formation of the SOT MRAM stack can cause back sputtering of material from a lower SOT layer, damaging the final MRAM stack and reducing the reliability of the device. Stacking SOT MRAM cells to increase device cell density offer additional opportunities for detrimental back sputtering to occur during fabrication of the stacked SOT MRAM cell elements. The disclosed inventions include devices and methods to fabricate stacked MRAM cell elements having a common SHE rail without detrimental back sputtering. Such methods provide higher device densities as the MRAM cell elements share a common footprint.

In an embodiment, a lower vertical SOT MRAM cell stack is etched from material layers deposited upon an underlying semiconductor device. As shown in FIG. 1, device 100 includes a succession of layers deposited upon the dielectric material 110 and the underlying device transistor contact 120 to form the vertical magnetic-tunnel junction (MTJ) stacks of the lower SOT MRAM cells. In an embodiment, the MTJ stacks include a simplistically depicted MTJ made of a first electrode layer 130, a reference magnetic layer 140 (a layer having a fixed magnetic dipole moment), a tunnel barrier layer 150, and a free magnetic layer 160 (a layer having a switchable magnetic dipole moment). First electrode layer 130 may include TaN or TiN deposited by CVD, PVD or similar methods. In an embodiment, bottom electrode 130 in between about 1 nm and about 10 nm in thickness. The reference layer 140 may include, for example one or more interfacial layers, or spacers, and ruthenium, cobalt, palladium, tantalum, iron, boron, cobalt-platinum (ColPt) or cobalt-palladium (ColPd), in multilayers or a mixture. In an embodiment, reference layer 140 is between about 3 nm and about 10 nm in thickness. Next, a tunnel barrier layer 150 is formed on reference layer 140. The tunnel barrier layer 150 may include a non-magnetic insulating material such as magnesium oxide (MgO). In an embodiment, tunnel barrier layer 150 is between about 1 nm and about 3 nm in thickness. Following the formation of the tunnel barrier layer 150, the free layer 160 is formed on top of the tunnel barrier layer 150. In this embodiment, the MTJ includes a seed layer (not shown) having free layer 160 grown thereon. The seed layer may include, for example, tantalum (Ta) or tantalum magnesium (TaMg) in some embodiments. The free layer 160 may include cobalt-iron-boron (CoFeB), for example. The respective layers may be formed by PVD. The free layer 160 and the reference layer 140 have perpendicular magnetic anisotropy.

In an embodiment, the lower SOT MRAM cell stacks are formed using a patterning and etching process such as RIE described above. A dielectric material 210 is deposited above and around the SOT MRAM cell stacks using, for example, evaporation, sputtering, plasma deposition, low pressure chemical vapor deposition (LPCVD), chemical vapor deposition, etc. Exemplary dielectric materials include SiN, SiCON, and SiCO. An interlayer dielectric (ILD) material 220 is disposed over the encapsulating dielectric material 210 and free magnetic layer 160. The dielectric materials are trimmed back using an anisotropic wet or dry etch to expose the upper surface of the free magnetic layer 160 material of the SOT MRAM cell stack. A chemical-mechanical planarization (CMP) process is used to provide a flat surface for the next step, the formation of the SHE layer word line, while also exposing the upper surface of the free magnetic layer 160. In an embodiment, SHE layer the word lines are formed by depositing a layer of conductive material, selectively etching that material and depositing a dielectric material similar to the dielectric material upon the etched structure.

Figure 2:
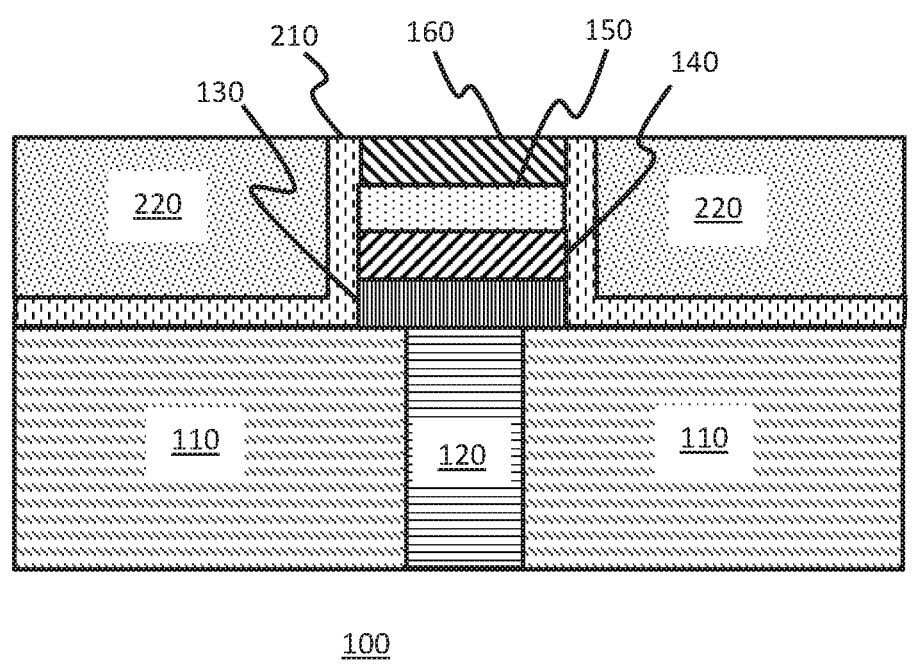
FIG. 2 provides a cross-sectional view of a step in the fabrication of a semiconductor device, according to an embodiment of the invention. The figure illustrates an MRAM stack etched from the MRAM layers and encapsulated by protective dielectric materials.

As shown in FIG. 2, layers 130-160 have been selectively etched away using ion-beam etching, leaving the lower SOT MRAM cell stack having a bottom electrode 130 in electrical contact with a contact 120 of a device element (e.g., a transistor) of the underlying semiconductor device, a reference layer 140, a tunnel barrier layer 150, and a free layer 160. As shown in the figure, dielectric spacer material 210 and interlayer dielectric material 220 have been deposited upon the lower SOT MRAM cell stack.

In an embodiment, the lower SOT MRAM cell stack has a first cross-sectional area of between about 80 $nm^2$ and about 2800 $nm^2$. The energy barrier associated with writing to the lower SOT MRAM cell stack is directly related to the geometry and volume of the free layer.

Figure 3:
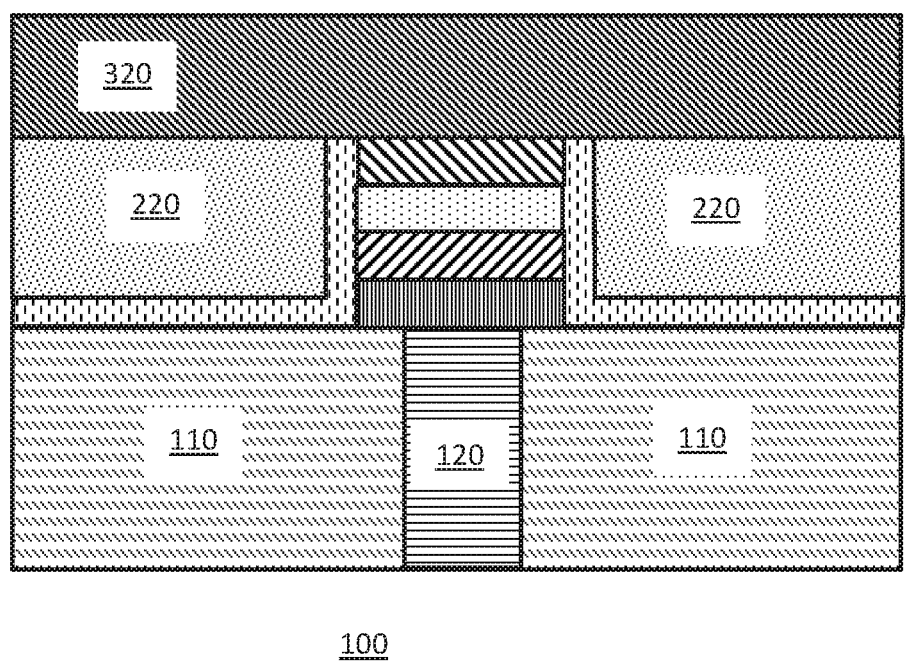
FIG. 3 provides a cross-sectional view of a step in the fabrication of a semiconductor device, according to an embodiment of the invention. The figure illustrates a spin-Hall-effect (SHE) layer formed upon the MRAM stack and dielectric spacer materials.

As shown in FIG. 3, ILD material 220 has been deposited upon the device as described above and smoothed using chemical-mechanical planarization (CMP) to provide a substantially smooth surface for the next step of the process. As shown in the figure, SHE layer 320 is deposited above dielectric spacer material 210, ILD material 220, and lower SOT MRAM stack free layer 160. In an embodiment, SHE layer 320 consists of a heavy, conductive metal such as platinum, palladium, tungsten, cobalt, tantalum, or similar conductive metals. In an embodiment, the SHE layer 320 has a thickness of between about 10 nm and about 50 nm. In an embodiment, SHE layer 320 consists of $Bi_2Se_3$. Deposition of the SHE layer occurs by deposition processes including, e.g., chemical vapor deposition (CVD), physical vapor deposition (PVD), atomic layer deposition (ALD), or similar processes. In an embodiment, the SHE layer 320, word line (not shown), connects to a power source and a write enabling transistor (not shown) of the underlying semiconductor device.

Figure 4:
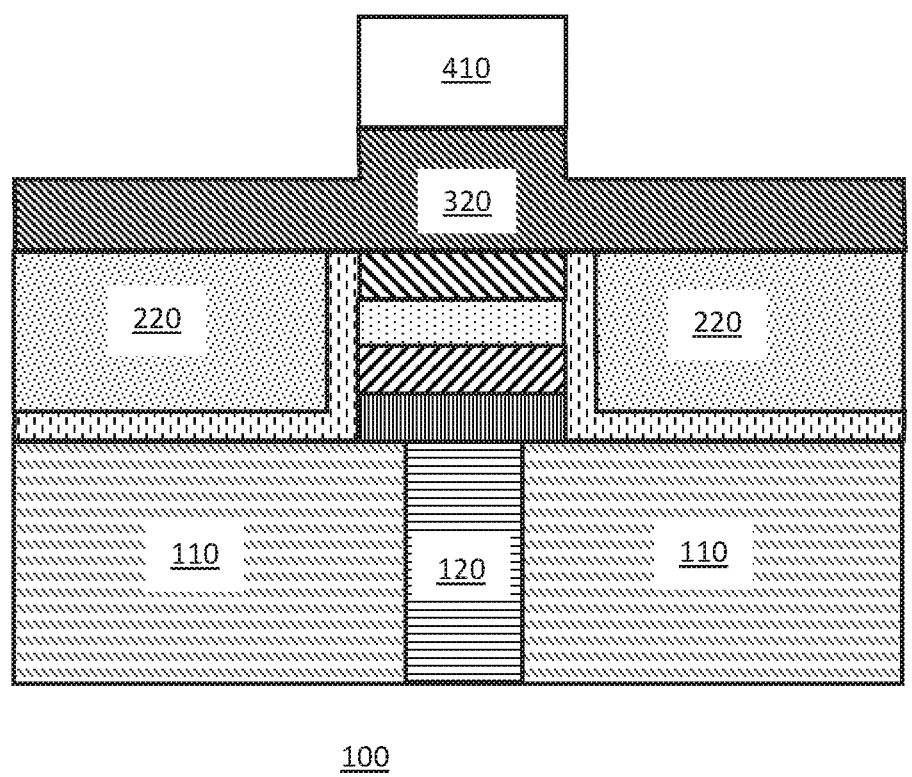
FIG. 4 provides a cross-sectional view, of a step in the fabrication of a semiconductor device, according to an embodiment of the invention. The figure illustrates the device after the addition and subsequent patterning of a hard mask layer as well as the SHE layer.

As shown in FIG. 4, a patterned hard mask layer 410 is disposed upon the SHE layer 320, and SHE layer 320 is selectively etched away leaving a protrusion of SHE layer material extending from the SHE layer. In an embodiment, the hard mask layer 410 consists of TaN or TiN deposited by CVD or PVD to a thickness of between about 20 nm and about 60 nm. The protrusion extends upward about 20 nm from the SHE layer and is disposed above the first SOT MRAM cell stack free layer 160. In an embodiment, hard mask layer 410 consists of a nitride, oxide, an oxide-nitride bilayer, or another suitable material. In some embodiments, the hard mask layer 410 may include an oxide such as silicon oxide (SiO), a nitride such as silicon nitride (SiN), an oxynitride such as silicon oxynitride (SiON), combinations thereof, etc. In some embodiments, the hard mask layer 410 is a silicon nitride such as $Si_3N_4$. After patterning and etching, the width or horizontal dimension (in direction X-X') of the hard mask layer 410 matches that of the underlying SHE layer 320 protrusion. The hard mask layer 410 may have a height or vertical thickness in a Z or surface normal direction ranging from 10 nanometers (nm) to 50 nm. In this embodiment, the hard mask layer 410 is deposited using a suitable material deposition method described above. In this embodiment, Hard mask layer 410 and SHE layer 320 are patterned and selectively etched to a horizontal cross-section similar to that of the lower SOT MRAM cell stack. In an embodiment, SHE layer 320 and hard mask layer 410 are anisotropically etched using IBE or reactive ion etching (RIE) or similar methods. The remainder of hard mask layer 410 is then selectively removed leaving the protrusion extending from the SHE layer 320.

Figure 5:
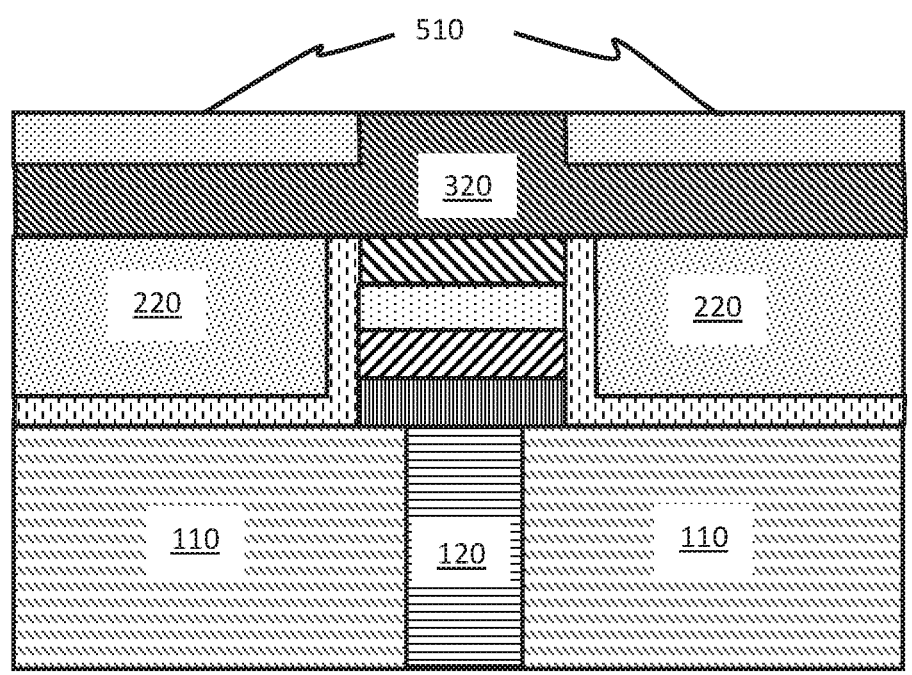
FIG. 5 provides a cross-sectional view of a step in the fabrication of a semiconductor device, according to an embodiment of the invention. The figure illustrates the device after the addition and CMP of a dielectric spacer.

After etching the SHE layer 320 forming the protrusion of SHE layer material extending above the remainder of the SHE layer 320, a protective dielectric layer 510 is deposited upon the SHE layer using deposition methods described above. CMP processes then level the dielectric layer and the protrusion at a common level as shown in FIG. 5.

Figure 6:
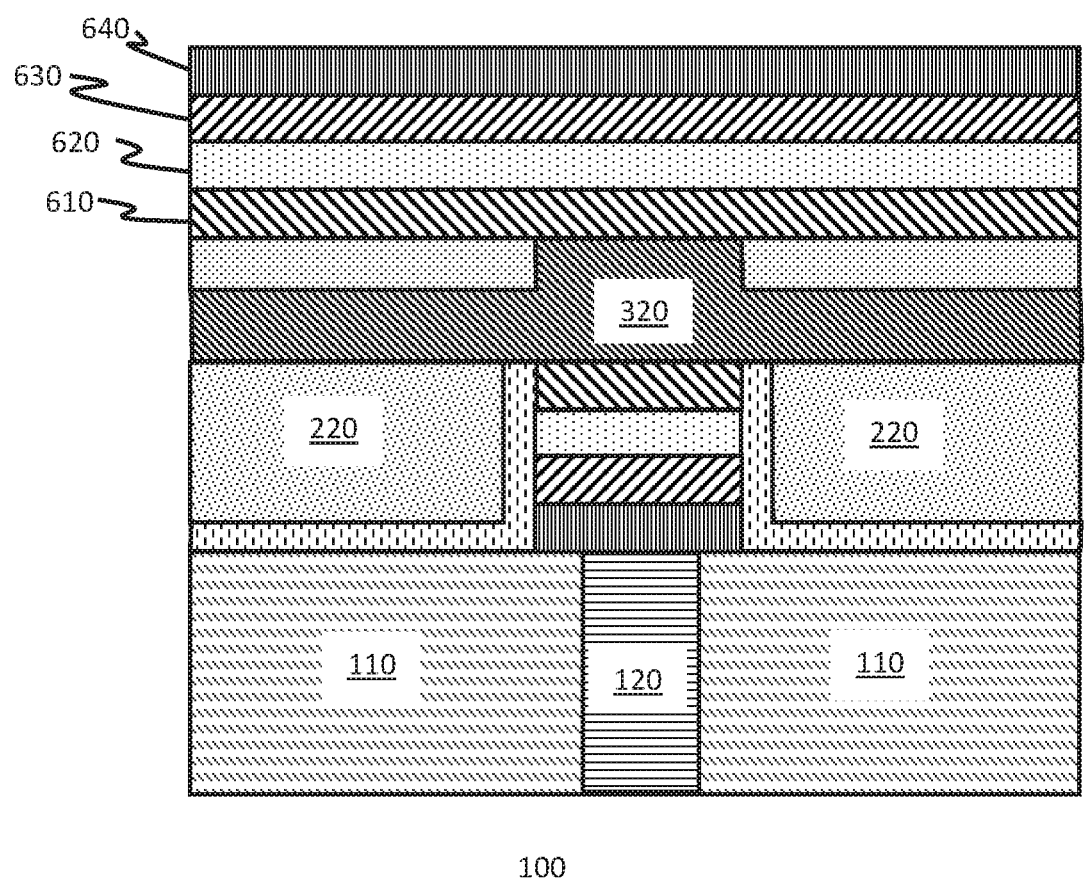
FIG. 6 provides a cross-sectional view of a step in the fabrication of a semiconductor device, according to an embodiment of the invention. The figure illustrates the device after the addition of patterned hard mask defining the second MRAM cell.

As shown in FIG. 6, a succession of layers is deposited upon dielectric layer 510 and the SHE layer 320 protrusion, to form the second vertical magnetic-tunnel junction (MTJ) stacks of the second SOT MRAM cell. In an embodiment, the SOT MRAM cell stack includes a simplistically depicted SOT MRAM cell stack including a free magnetic layer 610 (a layer having a switchable magnetic dipole moment), a tunnel barrier layer 620, a fixed magnetic layer 630 (a layer having a fixed magnetic dipole moment) and an upper contact electrode layer 640. In this embodiment, the SOT MRAM cell stack includes a seed layer (not shown) having free magnetic layer 610 grown thereon. The seed layer may include, for example, tantalum (Ta) or tantalum magnesium (TaMg) in some embodiments. The free magnetic layer 610 may include cobalt-iron-boron (CoFeB), for example. Next, a tunnel barrier layer 620 is formed on the free magnetic layer 610. The tunnel barrier layer 620 may include a non-magnetic insulating material such as magnesium oxide (MgO). Following the formation of the tunnel barrier layer 620, a fixed layer 630 is formed on top of the tunnel barrier layer 620. The fixed layer 630 may include, for example, one or more interfacial layers, or spacers, and cobalt-platinum (ColPt) or cobalt-palladium (ColPd), in multiple layers or a mixture, in various embodiments. The upper contact electrode layer 640 includes a conductive work function metal material. The respective layers may be formed by radio-frequency sputtering. The free magnetic layer 610 and the fixed layer 630 have perpendicular magnetic anisotropy.

Figure 7:
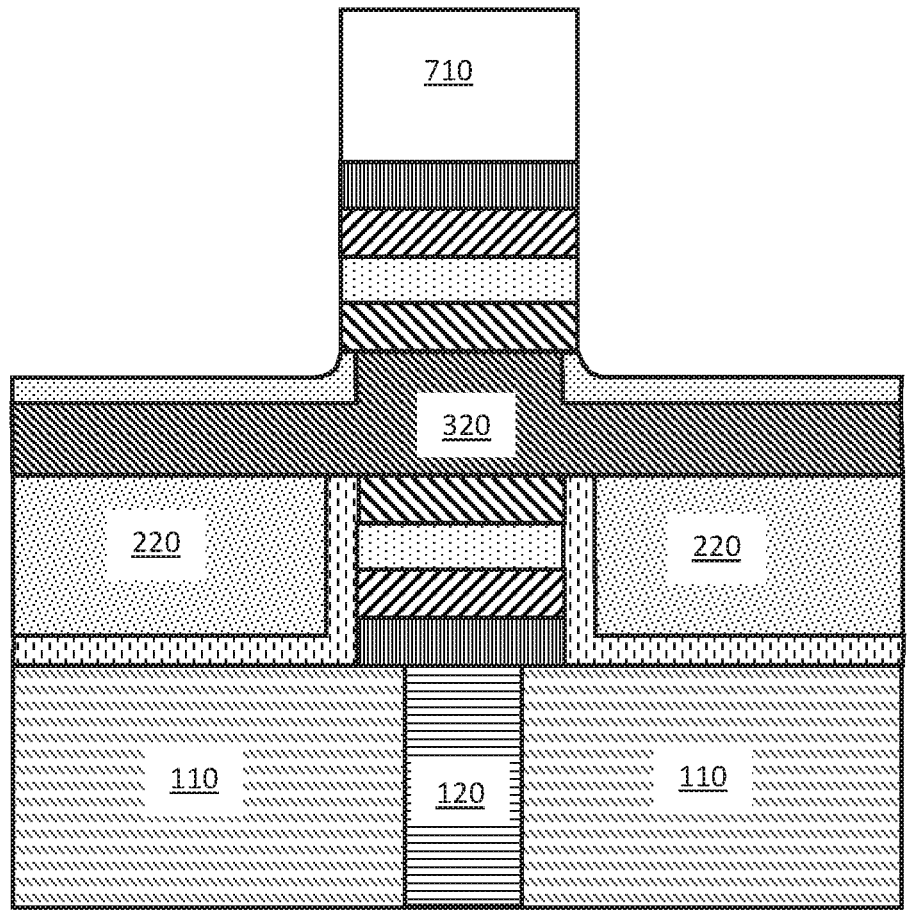
FIG. 7 provides a cross-sectional view of a step in the fabrication of a semiconductor device, according to an embodiment of the invention. The figure illustrates the device after the etching of the second MRAM cell stack.

In an embodiment illustrated in FIG. 7, the upper SOT MRAM cell stacks are formed using a patterning and etching process as described above. In this embodiment, a dielectric hard mask 710 is deposited and etched to the desired shape of the upper SOT MRAM cell stack. In an embodiment, the cross-sectional shape of the upper SOT MRAM cell stack exceeds the shape of the protrusion extending from the SHE layer. In this embodiment, etching the upper SOT MRAM cell stack layers proceeds into the dielectric layer 510, while protecting SHE layer 320, to prevent back sputtering and damage to the Supper SOT MRAM cell stack layers.

The energy barrier to writing an SOT MRAM cell varies in direct proportion to the volume of the free layer of the cell. In an embodiment, the volume of the free layer of the upper MRAM cell exceeds the volume of the lower MRAM cell by design as the volume of the upper SOT MRAM cell stack free layer exceeds that of the lower SOT MRAM cell stack free layer. For a design having similar free layer thicknesses for each of the upper and lower free layers, the upper volume exceeds the lower volume as the cross section of the upper free layer is larger than the cross section of the lower free layer. For this embodiment, the upper SOT MRAM cell has a higher energy barrier to writing than the lower SOT MRAM cell. In this embodiment, the lower SOT MRAM cell may be written independently of the upper SOT MRAM cell. In an embodiment, the upper and lower free layer thicknesses are adjusted in conjunction with horizontal cross-sections of the respective layers to tailor the respective energy barriers of the upper and lower SOT MRAM cells.

Figure 8:
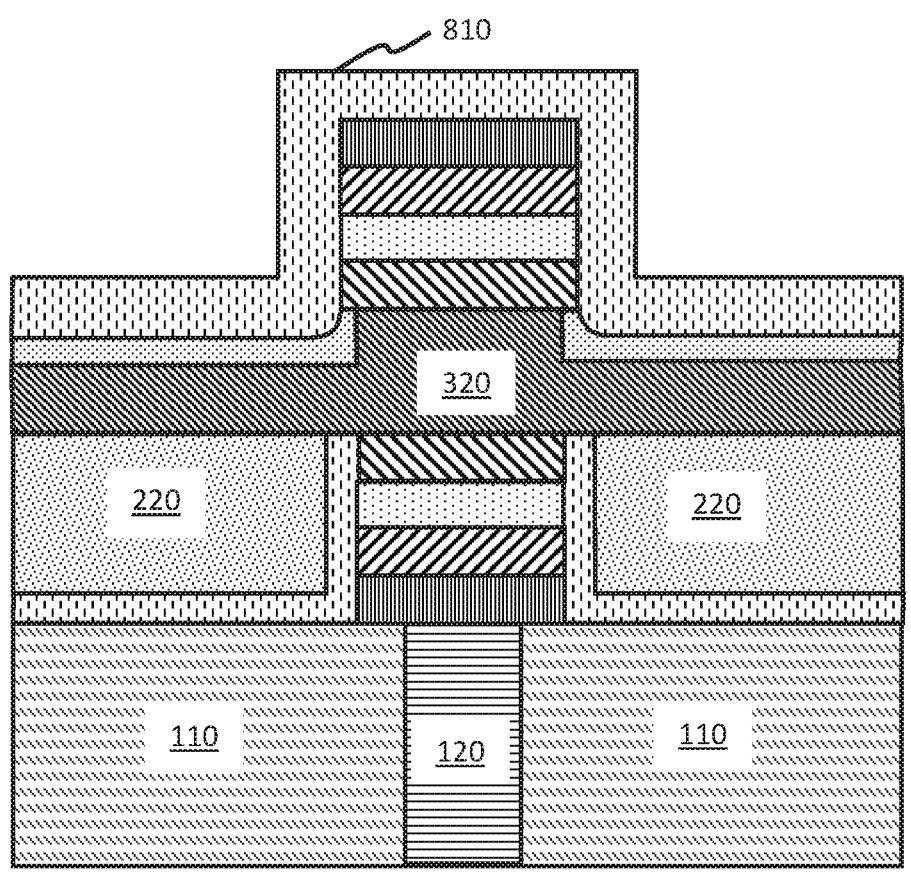
FIG. 8 provides a cross-sectional view of a step in the fabrication of a semiconductor device, according to an embodiment of the invention. The figure illustrates the device after the hard mask removal and deposition of the MRAM encapsulation layer.

As shown in FIG. 8, dielectric hard mask layer 710 is etched away as using an anisotropic etching method and an encapsulating dielectric material 810 is deposited above and around the SOT MRAM cell stacks, encapsulating the SOT MRAM cell stack layers. Encapsulating dielectric material 810 may be deposited using any of the dielectric deposition methods set forth above.

Figure 9:
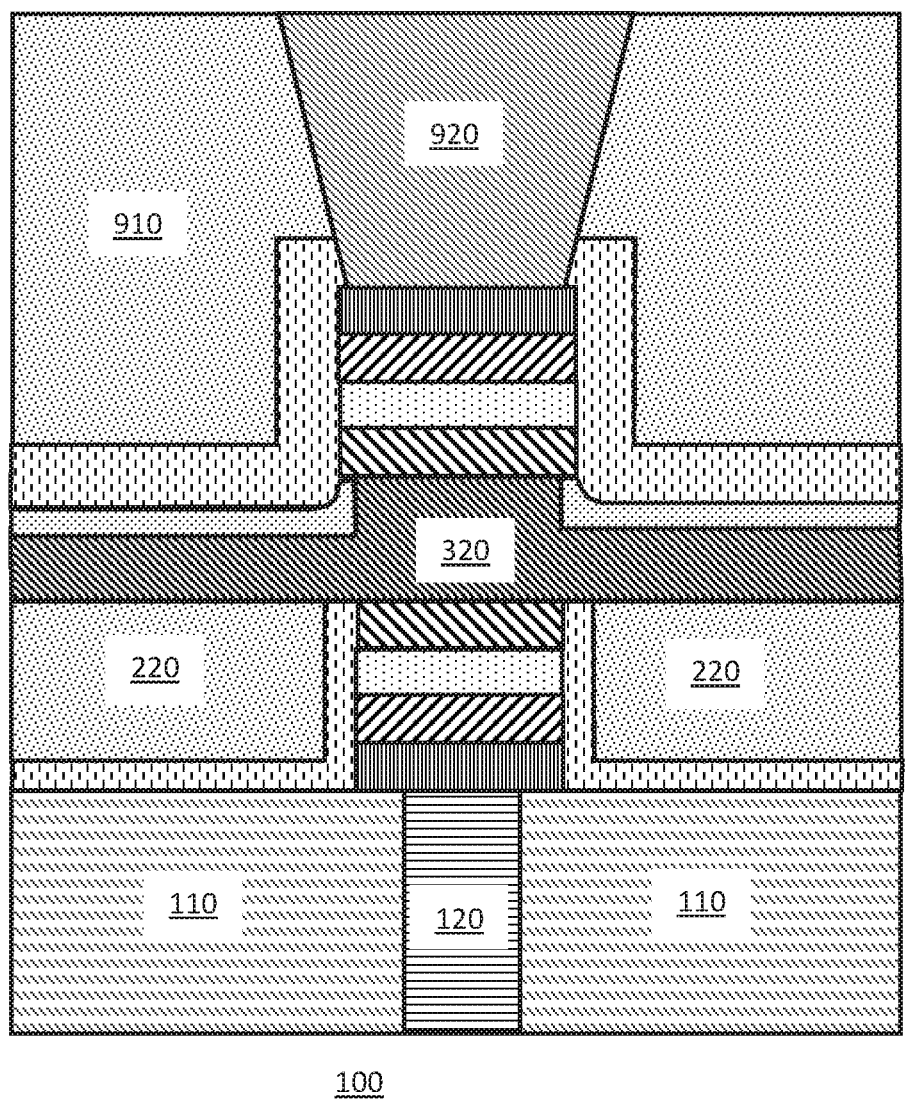
FIG. 9 provides a cross-sectional view of a step in the fabrication of a semiconductor device, according to an embodiment of the invention. The figure illustrates the device after the addition of an interlayer dielectric material and the addition of a metal contact.

Following the encapsulation of the upper SOT MRAM cell stacks, an interlayer dielectric (ILD) material is deposited and smoothed using CMP processes as described above. FIG. 9 illustrates the device after the deposition of the ILD 910 and the smoothing by CMP processes.

After the deposition of ILD 910, contact vias are etched through ILD 910 and encapsulating dielectric material 810 exposing a surface of the upper contact electrode layer 640. The contact vias are then filled with a conductive metal 920 using any of the deposition methods described herein. In an embodiment, conductive metal 920 includes any of Cu, Ru, Co, and W, deposited using CVD, PVD, or plating processes. In an embodiment, the conductive metal layer has a thickness of between about 30 nm and about 70 nm. RIE processes may be used to create the contact vias. CMP processes are then applied to create a smooth upper surface for the back-end-of-line processes needed to complete and package the final semiconductor device.

Figure 10:
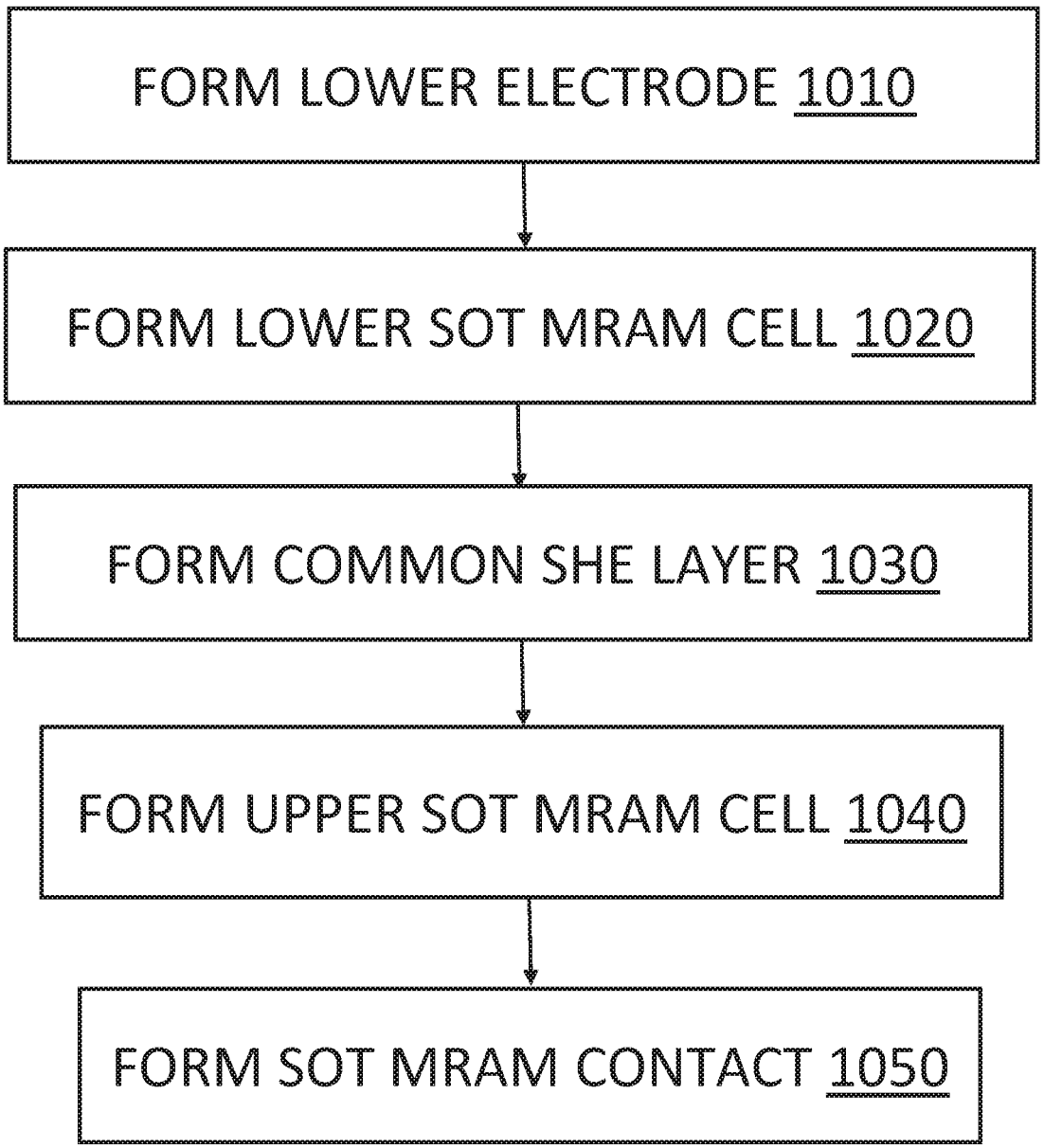
FIG. 10 provides a flowchart depicting operational steps for forming semiconductor device, according to an embodiment of the invention.

FIG. 10 provides a flowchart depicting operational steps associated with the fabrication of the disclosed SOT MRAM devices. According to the figure, at block 1010, a lower electrode is formed upon an underlying semiconductor device. The lower electrode includes a conductive metal layer deposited upon the underlying semiconductor device and selectively patterned and etched. The Underlying semiconductor device includes transistors ultimately used to control read and write operations of the stacked SOT MRAM cells. The upper surface of the underlying semiconductor device includes exposed metal contacts of the respective device read and write transistors.

At block 1020, the lower SOT MRAM cell stack is formed. The stack includes a succession of material layers, a reference layer having a fixed magnetic dipole moment, a tunneling junction layer, and a free layer having a switchable magnetic dipole moment. Each layer is formed across the entire cross section of the device and then masked and selectively etched back leaving the SOT MRAM stack including a lower electrode. The final lower SOT MRAM stack is disposed above and in electrical contact with a metal contact of a read transistor of the underlying semiconductor device. The formed stack is then encapsulated by a first dielectric material. The first dielectric material is etched back exposing the upper surface of the free layer of the SOT MRAM stack. An interlayer dielectric material is deposited over the device and a CMP process smooths the common upper surface of the ILD material, the encapsulating dielectric material and the free layer material. In an embodiment, the process yields an array of lower SOT MRAM cell stacks disposed across the surface of the device.

At block 1030 the common SHE layer of the lower stacked SOT MRAM cells is formed. The SHE layer includes a conductive metal. In an embodiment, the SHE layer includes a heavy metal—a metal having a density greater than 5 g/cm$^3$—such as platinum or tantalum. The SHE layer is disposed adjacent to and above the surfaces of the SOT MRAM cells free layers and associated dielectric materials. The SHE layer is further disposed in electrical contact with a write transistor of the underlying semiconductor device. Portions of the upper surface of the SHE layer are then selectively etched back yielding a plurality of protrusions extending from an upper surface of the SHE layer. Each protrusion extending from the upper surface of the SHE layer is disposed above a formed lower SOT MRAM stack. A dielectric material is then disposed to fill around the protrusions. A CMP process then smooths the combination of protrusions and dielectric material, leaving an upper surface of the protrusions exposed.

At block 1040 the upper SOT MRAM stack is formed. Successive layers of free layer material, tunneling junction material, fixed layer material, and upper conductive electrode layer material are disposed upon the device, a hard mask layer is added above the upper conductive electrode layer and the combined structure is masked and selectively etched away resulting in the upper SOT MRAM stack. The hard mask layer is subsequently removed from the upper SOT MRAM cell stack. The horizontal cross-section of the upper SOT MRAM stack is larger than the horizontal cross-section of the SHE layer protrusion, and also larger than the horizontal cross-section of the lower SOT MRAM stack. As the upper SOT MRAM stack cross-section is larger than that of the SHE layer protrusion, etching the upper stack can proceed into the dielectric material surrounding the SHE layer protrusions without a risk of SHE layer material back sputtering during the etching process and contaminating the upper SOT MRAM stack layers.

The relative energy barriers to writing each of the upper and lower SOT MRAM cells are directly proportional to the volume of the free layer of each SOT MRAM cell. The combination of horizontal cross-section and layer thickness of the two layers can be manipulated in the device design to tailor the absolute magnitude of the respective energy barriers as well as the relative magnitude of the two energy barriers. In an embodiment, the upper energy barrier is greater than the lower energy barrier enabling each of the two SOT MRAM cells to be written by the application of a distinct write energy.

After the upper SOT MRAM cell stack is formed, an encapsulating dielectric material is disposed over the stack. An ILD is then disposed over the device and a CMP process is performed to trim and smooth the upper surface of the device in preparation for further device fabrication steps.

At block 1050 the upper contact for the upper SOT MRAM cell is formed. A via is etched in the ILD and filled with a conductive material. A CMP process trims and smooths the upper surface of the device in preparation for further back-end-of-line processes.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An MRAM (magnetoresistive random-access memory) structure comprising:
   a first vertical MRAM stack disposed upon a bottom electrode;
   a spin-Hall-effect (SHE) rail disposed above and in electrical contact with the first vertical MRAM stack; and
   a second vertical MRAM stack disposed above and in electrical contact with the SHE rail;
   wherein the first vertical MRAM stack has a first write energy barrier and the second vertical MRAM stack has a second write energy barrier; wherein the first write energy barrier is different than the second write energy barrier.

2. The MRAM structure according to claim 1 wherein the second vertical MRAM stack comprises a larger cross-sectional area than a cross-sectional area of the first vertical MRAM stack.

3. The MRAM structure according to claim 1, wherein the first vertical MRAM stack comprises a magnetic tunnel junction.

4. The MRAM structure according to claim 1, wherein the SHE rail comprises a conductive material.

5. The MRAM structure according to claim 1, wherein the SHE rail comprises a protrusion disposed above the first vertical MRAM stack, and wherein the second vertical MRAM stack is disposed above the protrusion.

6. The MRAM structure according to claim 1 wherein a free layer of the first MRAM stack is disposed adjacent to the SHE rail.

7. A magnetoresistive random-access memory (MRAM) structure comprising:
   a first vertical MRAM stack disposed upon a bottom electrode, the first vertical MRAM stack disposed in electrical communication with a transistor;
   a spin-Hall-effect (SHE) rail disposed above and in electrical contact with the first vertical MRAM stack; and
   a second vertical MRAM stack disposed above and in electrical contact with the SHE rail;
   wherein the first vertical MRAM stack has a first write energy barrier and the second vertical MRAM stack has a second write energy barrier; wherein the first write energy barrier is different than the second write energy barrier.

8. The MRAM structure according to claim 7, wherein the second vertical MRAM stack comprises a larger cross-sectional area than a cross-sectional area of the first vertical MRAM stack.

9. The MRAM structure according to claim 7, wherein the first vertical MRAM stack comprises a magnetic tunnel junction.

10. The MRAM structure according to claim 7, wherein the SHE rail comprises a conductive material.

11. The MRAM structure according to claim 7, wherein the SHE rail comprises a protrusion disposed above the first vertical MRAM stack, and wherein the second vertical MRAM stack is disposed above the protrusion.

12. The MRAM structure according to claim 7 wherein a free layer of the first MRAM stack is disposed adjacent to the SHE rail.

13. A method of fabricating a semiconductor device, the method comprising:
    forming a first vertical magnetoresistive random-access memory (MRAM) cell stack upon a first electrode;
    forming a spin-Hall-effect (SHE) layer above and in electrical contact with the first vertical MRAM cell stack;
    forming a protective dielectric layer covering a portion of the SHE layer;
    forming a second vertical MRAM cell stack above and in electrical contact with an exposed portion of the SHE layer;
    forming a second electrode above and in electrical contact with the second vertical MRAM cell stack; and
    forming a metal contact above and in electrical connection with the second electrode;
    wherein the first vertical MRAM stack has a first write energy barrier and the second vertical MRAM stack has a second write energy barrier; wherein the first write energy barrier is different than the second write energy barrier.

14. The method of fabricating a semiconductor device according to claim 13, wherein the first electrode is disposed in electrical contact with an underlying semiconductor device transistor.

15. The method of fabricating a semiconductor device according to claim 13, further comprising forming the first vertical MRAM cell stack having a first cross-sectional area and forming the second vertical MRAM cell stack having a second cross-sectional area; wherein the second cross-sectional area differs from the first cross-sectional area.

16. The method of fabricating a semiconductor device according to claim 13, further comprising forming a protrusion on the SHE layer, wherein the protrusion is disposed above the first vertical MRAM cell stack.

17. The method of fabricating a semiconductor device according to claim 13, further comprising forming a free layer of the first vertical MRAM cell stack adjacent to and in electrical contact with the SHE layer.

18. The method of fabricating a semiconductor device according to claim 13, wherein the SHE layer comprises a conductive metal.

* * * * *